United States Patent
Kee et al.

(10) Patent No.: US 6,724,255 B2
(45) Date of Patent: Apr. 20, 2004

(54) CLASS E/F SWITCHING POWER AMPLIFIERS

(75) Inventors: Scott David Kee, Pasadena, CA (US); Ichiro Aoki, Arcadia, CA (US); Seyed-Ali Hajimiri, Pasadena, CA (US); David B. Rutledge, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 23 days.

(21) Appl. No.: 09/974,557

(22) Filed: Oct. 9, 2001

(65) Prior Publication Data

US 2002/0101284 A1 Aug. 1, 2002

Related U.S. Application Data

(60) Provisional application No. 60/239,473, filed on Oct. 10, 2000.

(51) Int. Cl.$^7$ .............................. H03F 3/217; H03F 1/14
(52) U.S. Cl. .................... 330/251; 330/207 A; 330/292
(58) Field of Search ............................ 330/207 A, 251, 330/292

(56) References Cited

U.S. PATENT DOCUMENTS

| | | | |
|---|---|---|---|
| 3,430,157 A | | 2/1969 | Wood .......................... 330/192 |
| 3,919,656 A | | 11/1975 | Sokal et al. .................. 330/51 |
| 4,607,323 A | | 8/1986 | Sokal et al. .................. 363/97 |
| 4,717,884 A | | 1/1988 | Mitzlaff ....................... 330/251 |
| 4,772,856 A | * | 9/1988 | Nojima et al. ............... 330/251 |
| 5,146,178 A | | 9/1992 | Nojima et al. ............... 330/251 |
| 5,327,337 A | * | 7/1994 | Cripe .......................... 363/134 |
| 5,525,871 A | * | 6/1996 | Bray et al. ................... 315/248 |
| 6,232,841 B1 | * | 5/2001 | Bartlett et al. ............... 330/305 |

OTHER PUBLICATIONS

Asbeck et al., "Device and Circuit Approaches for Next–Generation Wireless Communications," Technical Feature, reviewed by Microwave Journal Editorial Board, 1998.

Iwadare et al., "Even Harmonic Resonant Class E Tuned Power Amplifier Without RF Choke," *Electronics and Communications in Japan*, Part 1, vol. 79, No. 1, 1996.

Radisic et al., "Novel Architectures for High–Efficiency Amplifiers for Wireless Applications," *IEEE Transactions on Microwave Theory and Techniques*, vol. 46, No. 11, Nov. 1998.

Rofougaran, "A 900 MHz RF Power Amplifier in 1 μm CMOS for a Spread–Spectrum Communication Transceiver," (A thesis submitted in partial satisfaction of the requirements for the degree Master of Science in Electrical Engineering) The Unversity of California, Los Angeles, CA, 1995.

Trask, "Class–F Amplifier Loading Networks: A Unified Design Approach," ATG Design Services, P.O. Box 25240, Tempe, Arizona 85285–5240, undated.

(List continued on next page.)

*Primary Examiner*—Patricia Nguyen
(74) *Attorney, Agent, or Firm*—Christopher J. Rourk; Akin Gump Strauss Hauer & Feld, LLP

(57) ABSTRACT

The present invention discloses a new family of switching amplifier classes called "class E/F amplifiers." These amplifiers are generally characterized by their use of the zero-voltage-switching (ZVS) phase correction technique to eliminate of the loss normally associated with the inherent capacitance of the switching device as utilized in class-E amplifiers, together with a load network for improved voltage and current wave-shaping by presenting class-F$^{-1}$ impedances at selected overtones and class-E impedances at the remaining overtones. The present invention discloses a several topologies and specific circuit implementations for achieving such performance.

18 Claims, 11 Drawing Sheets

OTHER PUBLICATIONS

RF Circuit Design at UC Santa Barbara: Jul. 16, 1999 (Revised Dec. 10, 1999).

Inoue et al., "High–Efficiency 0.1 cc Power Amplifier Module for 900 MHz Personal Digital Cellular Telephones," *IEICE Trans. Electron*, vol. E82–C, No. 11, Nov. 1999.

Wei et al., "Analysis and Experimental Waveform Study on Inverse Class Class–F Mode of Microwave Power FETS,", Alpha Industries, Inc., Woburn, MA, *IEEE MTT–S Digest*, pp. 525–528, 2000.

Inoue et al., "Analysis of Class–F and Inverse Class–F Amplifiers," High Frequency and Optical Semiconductor Division, Mitsubishi Electric Corprporation, Japan, *IEEE MTT–S Digest*, pp. 775–778, 2000.

* cited by examiner

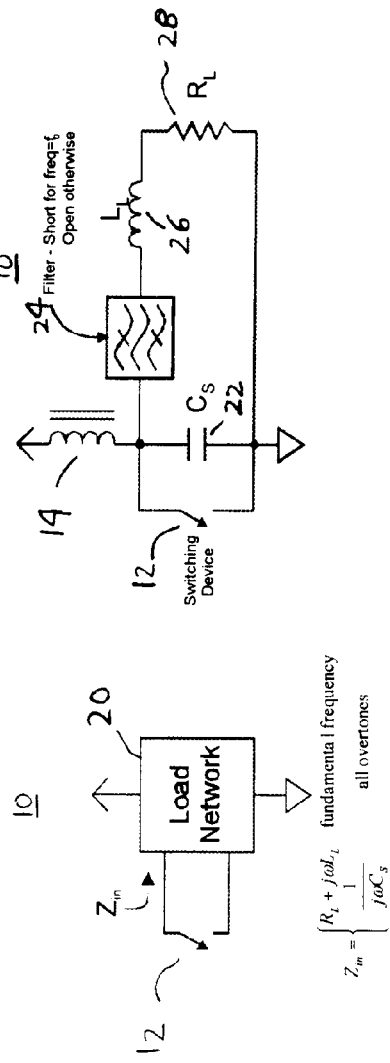
FIG. 2 *Prior Art*
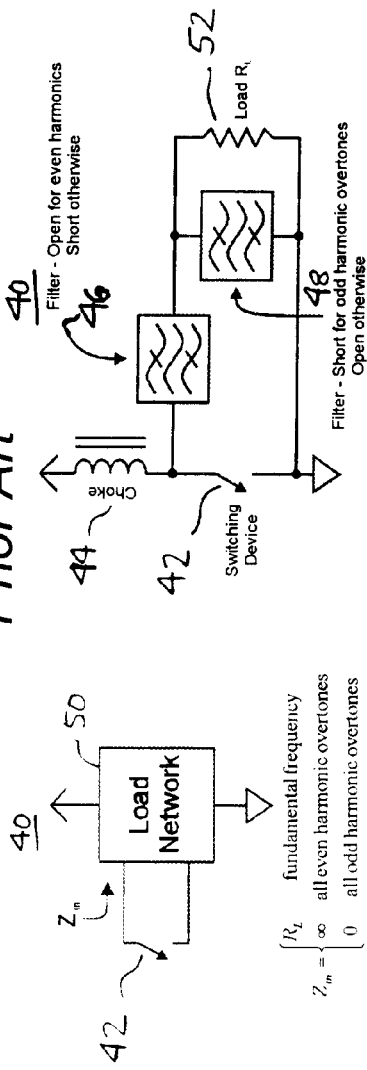
FIG. 3 *Prior Art*

CLASS E/F SWITCHING POWER AMPLIFIERS

CROSS-REFERENCE TO RELATED APPLICATIONS

This application claims the benefit of U.S. Provisional Application No. 60/239,473 filed on Oct. 10, 2000.

STATEMENT AS TO FEDERALLY SPONSORED RESEARCH

The U.S. Government may have certain rights in this invention pursuant to ARO-ARMY RESEARCH OFFICE Grant no. DAAG55-97-1-0254.

BACKGROUND OF THE INVENTION

1. Field of the Invention

The present invention relates to high efficiency power amplifiers and more particularly to a new class of switching power amplifiers that is a hybrid of class E and inverse class F (class $F^{-1}$) power amplifiers.

2. Description of the Related Art

Power amplifiers are classified in several different categories such as A, AB, B, C, D, E, F, S, etc. based on their fundamental characteristics, which relate to circuit topology and principle of operation. Each class presents relative advantages and disadvantages in their operating characteristics, such as linearity, power efficiency, bandwidth, frequency response, etc., and is chosen according to the application requirements.

More particularly, RF power amplification can be realized using active devices (i.e. transistors, vacuum tubes), that function as linear amplifiers, switching amplifiers or as a combination of both. Since linear amplifiers (e.g. classes A and B) are relatively inefficient at producing radio frequency (RF) output from an applied signal and direct current (DC) supply power, operating an active device as a linear amplifier is not an ideal solution for power amplifier applications requiring high efficiencies. Rather, designing the active device to operate as a switch is preferred because this mode of operation causes the device to be in a saturated or cut-off condition most of the time and therefore dissipates relatively little power by keeping the device out of the much lossier active region. In many applications, such as portable communication devices (e.g. cell phones) and high-power industrial generators (e.g. plasma drivers and broadcast transmitters), where low power consumption and low dissipation are crucial, high efficiency switching amplifiers are an attractive solution due to the performance and cost advantages they allow.

FIG. 1 simplified block diagram of a generic switching power amplifier 6 designed into a conventional RF transmission system 1. The system includes a driver 4, the power amplifier 6, comprising a switch 5 and load network 7, and a load 8. The input signal 2 to be amplified is input to the driver stage 4, which controls the active device 5 in the amplifier. The active device acts substantially as a switch when appropriately driven by the driver and thus is represented as a single-pole, single throw switch. The active device is powered by a dc power supply 3, and has an output connected to the input of the load network 7. The output of the load network 7 is connected to the load 8, such as an antenna. As the switch 5 is cyclically operated at the desired output frequency, or fundamental frequency, $f_o$, the dc energy is converted into ac energy at this switching frequency and its harmonics. The load network 7 may employ one or more filters to control the power dissipation caused by switching action (i.e. the efficiency of the device), reduce the level of the harmonic overtones at the load, and/or provide impedance transformation. The design of the load network determines the behavior of the voltage and currents in the switching amplifier 6, and thus the class of operation by which the amplifier is denoted.

Realizing highly efficient switching operation at high frequencies, however, has been challenging due to finite switching times in the active device and package parasitic impedances. Nonetheless, among the known types of power amplifiers, when an application requires highly power-efficient amplification at high operating frequencies, ostensibly the most appropriate known types are class E and F amplifiers.

Class E Amplifiers

The class E amplifier achieves high efficiency at high frequencies by essentially eliminating the dominant cause of the switching power dissipation that occurs in other types of switching amplifiers, namely the loss associated with capacitive discharge. In virtually every switching-mode power amplifier, a capacitance, CS, shunts the power switch. At a minimum, this capacitance is the inherent parasitic capacitance, $C_{out}$, of the circuit components (transistor) and wiring; the circuit designer might intentionally wish to add additional capacitance. In other types of switching amplifiers (other than the Class E amplifier), this shunt capacitance is typically undesirable. The reason is that if the switch is turned on when the voltage across the switch and its shunt capacitance is nonzero, the energy stored in the charged capacitance will be dissipated as heat; the energy is $C_s V^2/2$, where $C_s$ is the capacitance shunting the switch and V is the voltage across the switch (and hence across the capacitance) when the switch is turned on. If the switching frequency is $f_o$, the power dissipation is $C_s V^2 f_o/2$. Note that the power dissipation is directly proportional to the switching frequency. Thus, for a high-frequency power amplifier, this power dissipation can become a severe drawback, often becoming the dominant power loss mechanism. Moreover, while the switch is discharging this capacitor, the switch is subjected to both the capacitor voltage and the discharge current, simultaneously. If the simultaneous voltage and current are large enough, they can cause destructive failure and/or performance degradation of the power transistor.

These difficulties can be avoided by ensuring Zero-Voltage-Switching (ZVS) operation, i.e. demanding that the voltage across the switch be substantially zero when the switch is turned on. This feature of the class-E amplifier allows this class to readily accommodate the switching device output capacitance without seriously degrading performance by using this capacitance in the load network and designing the load network so that the capacitor voltage is zero at just before the device turn-on.

In addition to the problems with turning on the switch, switching off (opening) a power switch inherently subjects it to simultaneous high voltage and high current (hence further power dissipation and device stress). Fortunately, unlike the turn-on loss, this loss mechanism can be made arbitrarily small by choosing a faster device or increasing the device drive level sufficiently so as to reduce the device turn-off time. Although it is possible to design a switching amplifier to achieve ZCS (zero-current-switched) operation, wherein the device current is zero just before the transistor switches off thereby eliminating turn-off loss, it is believed to be impossible to achieve ZVS and ZCS conditions simultaneously. While the turn-off loss can be reduced by other means, the turn-on loss is dependent only on the switching voltage and the capacitance, $C_S$, which cannot be reduced arbitrarily as it is an inherent property of the active device. Therefore, ZVS switching has been found to be the most appropriate for high-efficiency operation using modern high-speed devices. By properly choosing the relative values of the circuit components (including the switch capacitance $C_S$, the load resistance $R_L$, and load inductance $L_L$), class E therefore allows for ZVS switching to reduce switching loss using a very simple circuit.

Thus, with relatively simple circuit topology, class E operation achieves low power dissipation and low device stress by (a) incorporating the switch shunt capacitance as part of a network, allowing its detrimental effects to be accounted for and minimized and (b) using a resonant load network whose transient response after the switch turn-off brings the switch voltage back to zero (or nearly zero) at the time the switch will next be turned on. A schematic of a typical class E amplifier circuit is shown in the simplified diagram of FIG. 2. The power amplifier 10 includes a switching device 12 and a load network 20. DC power is supplied to the device 12 via a choke 14. The network includes a simple filter 24 which is connected in series to an RL load, represented by $L_L$ 26, and $R_L$ 28, respectively. As a class E device, the filter acts as a short circuit at the fundamental frequency, and an open circuit at all harmonics. The inherent shunt capacitance, $C_{out}$, of the active device 12 (e.g. between the anode and cathode of a three terminal transistor) is incorporated into the network as all or part of capacitor $C_s$ 22 which may include additional capacitance added by the designer. Thus, the impedance looking into the load network, $Z_{in}$, is: at $f_o$, $Z_{in}=(R_L+j\omega_0 L_L)\|(1/j\omega_0 C_S)$ which if properly designed is a substantially inductive load (i.e. a load consisting of both a resistance and an inductance), i.e. $Z_{in}=R_{eff}+j\omega_0 L_{eff}$; and at all harmonic overtones, $Z_{in}=1/j\omega C_S$. The inductance of the fundamental frequency load, when properly sized relative to the capacitance $C_S$ and the effective load resistance $R_{eff}$, performs a phase correction of the fundamental frequency harmonic components, allowing the ZVS operation to be achieved.

Class F and $F^{-1}$ Amplifiers

Class F is another well-known class of switching mode amplifiers. The class F amplifier derives its improved efficiency by using a multiple resonator load network to control the harmonic content of the active device's output voltage and/or current waveforms. In realizing a class F circuit, the active device operates primarily as a switch and the load network, generally, is designed to yield short-circuit impedances at even harmonics of the fundamental frequency and to yield open-circuit impedances at odd harmonics of the fundamental frequency.

Efficient operation of a class F amplifier is realized when the output voltage of the active device (transistor) is driven rapidly from saturation (low resistance) to cutoff (high resistance) voltage. In operation, the combination of the active device and the output network produces a half sine wave current when the device is saturated. A high Q resonant circuit for all odd harmonics up to the $N^{th}$ harmonic, often consisting of several parallel LC filters, makes possible odd harmonic components in the output voltage by providing high impedances to the active device at these frequencies. These odd harmonic voltages sum with the fundamental frequency output voltage to effectively flatten the output voltage waveform. This results in a combination of higher efficiency and higher power output. Additionally, resonant circuits are provided at all even harmonics up to the $N^{th}$ harmonic to short circuit the active device at these frequencies, thereby allowing the current waveform to approximate a half-sinusoid, further increasing the efficiency without any decrease in output power. A high Q filter circuit is tuned to the fundamental frequency to reject harmonics at the load and yield a sinusoidal output signal. In this configuration, the device's inherent parasitic capacitance must be kept small in order to avoid shorting the high impedance presented by the resonant circuit at the odd harmonics. Although this problem can be somewhat minimized by resonating this capacitance with the load network, this technique further increases the complexity of the network. Additionally, if the active device is to be driven very hard so that it switches very quickly, a large number of harmonics must be tuned in order to achieve the benefit of class F operation. As a consequence of these limitations, class F is normally used only in applications where the transistor speed is relatively slow compared to the frequency of operation and using relatively small (i.e. low capacitance) devices, so that only a few harmonics need be tuned and so that the effect of the capacitance is small.

A variation to the conventional class F amplifier is to invert the impedances at the harmonic overtones. Thus, the load network is designed to yield open circuit impedances at every even harmonic up to the $N^{th}$ harmonic and short circuit impedances at every odd harmonic up to the $N^{th}$ harmonic. Such an amplifier is called the inverse class-F, or class $F^{-1}$ amplifier and one implementation is shown schematically in FIG. 3. In particular, this class $F^{-1}$ amplifier 40 includes a switching device 42 and load network 50 that comprises a filter 46 in series with the output of the switch and the resistive load 52 and a second filter 48 in parallel with the load 52. The series filter 46 presents relatively open circuit impedances for even harmonics and short circuit impedances for all other harmonics. The parallel filter 48 presents relatively short circuit impedances for all odd harmonics and open circuit impedances otherwise. Thus, the impedance looking into the load network, $Z_{in}$, is: at $f_o$, $Z_{in}=R_L$; at all even harmonics $Z_{in}=\infty$(open); and at all odd harmonics $Z_{in}=0$ (short). This amplifier class has many of the benefits of class F, and additionally has the property of near-ZVS operation, although this quality is difficult to achieve in the presence of a large parasitic device capacitance $C_{out}$. Although class $F^{-1}$ has been largely ignored for many years, several recent works have shown that this class of operation compares favorably to class F using modern solid-state devices.

When class E and F power amplifier performances are compared, a significant advantage of a class E amplifier over a class F amplifier is its circuit topology, which incorporates the switching device output parasitic capacitance as part of its circuit. Thus, class E amplifiers do not lose power efficiency due to the charging and discharging of this parasitic capacitor as can occur in amplifier classes such as class F and class $F^{-1}$ which do not account for the capacitor's effect, nor do they require elaborate resonant circuits to reduce the effect of this capacitance. In addition, as seen above, the class E design is relatively simple, consisting of just a few components (at least one less filter than in the class F design). Unlike class F and $F^{-1}$ designs, the class E design receives the full promised benefits of its operating class with this simple circuit, whereas the class F and $F^{-1}$ approaches must incorporate increasingly larger numbers of circuit elements in order to approach the ideal class F performance. On the other hand, due to its anode (i.e., transistor drain or collector) voltage and current wave formats, class F amplifiers deliver significantly higher power and promise higher power-efficiency than class E amplifiers when they are using the same transistor under the same supply conditions. To gain this advantage, class F and $F^{-1}$ circuits can be quite complex and can use many more components than class E devices.

Thus, it would be highly desirable to have a power amplifier capable of very efficiently providing high power at high frequencies and that incorporates some the best features of both class E and class F amplifiers.

SUMMARY OF THE INVENTION

The present invention, which addresses these needs, resides in a high efficiency switching power amplifier for amplifying a high frequency input signal having at least one fundamental frequency, and that is adapted to drive a load. The amplifier includes a high-speed active device and a hybrid class E/F load network. The active device comprises a switching component that operates substantially as a switch and a parasitic capacitance, $C_{out}$, in parallel with the switching component. The hybrid class E/F load network connected to the active device.

In one embodiment, the hybrid class E/F load network is configured to present to the switching component of the active device, at all harmonic frequencies substantially present in at least one of the voltage and current waveforms of the active device, a substantially inductive load at each fundamental frequency, a substantially open circuit at a predetermined number, $N_E$, of even harmonic overtones for each fundamental frequency up to an $N^{th}$ harmonic, a substantially short circuit at a predetermined number, $N_O$, of odd harmonic overtones for each fundamental frequency up to an $N^{th}$ harmonic, and a substantially capacitive impedance load at the remaining harmonic overtones, up to an $N^{th}$ harmonic. In this embodiment, $N \geq 3$ and $1 < N_E + N_O \leq N-2$. Thus, the amplifier has some characteristics of both a class E and class F amplifier. In a more specific example, if NE=1, then $N_O > 0$.

More specifically, the load network includes a two port filter network having an input port and an output port, the input port being connected to the active device in parallel with the parasitic output capacitance $C_{out}$, and the output port being connected to the load. The load network may also be configured to provide wideband tuning of an input signal having a fundamental frequency range from $f_1$ to $f_2$, where $f_2 < 3f_1$.

In another broad implementation of the present invention, the hybrid class E/F load network connected to the active device is configured to present to the active device a substantially inductive load at the fundamental frequency of operation, a substantially open circuit at a predetermined number of even harmonic overtones of the fundamental frequency, a substantially short circuit at a predetermined number of odd harmonic overtones of the fundamental frequency, and a substantially capacitive impedance load at the remaining harmonic overtones.

In yet another implementation of the present invention, the hybrid class E/F load network is configured to present to the switching component, at all harmonic frequencies that are substantially present in at least one of the voltage and current waveforms of the active device, a substantially inductive load at each fundamental frequency of operation that results in substantially zero-voltage-switching (ZVS) operation of the active device, impedances substantially larger in magnitude than $1(2\pi fC_S)$ at a predetermined number, $N_E$, of even harmonic overtones of each fundamental frequency, impedances substantially smaller in magnitude than $1/(2\pi fC_S)$ at a predetermined number, $N_O$, of odd harmonic overtones of each fundamental frequency, and an impedance substantially equal to $1/j\omega C_S$ at the remaining harmonic overtones of each fundamental frequency. $C_S = C_{out} + C_{added}$, where $C_{added} \geq 0$, and $N_E \geq 0$, $N_O \geq 0$, and the total number of tuned harmonic overtones, $N_E + N_O$, is at least one and less than the total number of harmonic overtone frequencies substantially present in the active device's at least one of voltage and current waveforms. Since the network need not operate to provide substantially open and short circuits, as in the prior examples, the network can be simplified to a significant degree.

In yet another implementation of the present invention, a multiple active device high efficiency switching power amplifier for amplifying a high frequency input signal having at least one fundamental frequency and adapted to drive a load, is disclosed. In this case, a first high-speed active device having a parasitic output capacitance, $C_{out1}$, and adapted to operate substantially as a switch, and a second high-speed active device having a parasitic output capacitance, $C_{out2}$ and adapted to operate substantially as a switch, are provided together with a hybrid three-port class E/F load network. The network has a first port connected to the first active device, a second port connected to the second active device, and a third port connected to the load, such that when the first and second active devices are driven in a push-pull configuration, the network presents to the switching component an effective input impedance that provides a substantially inductive load in series with the substantially resistive load at all fundamental frequencies; a substantially open circuit at one or more even harmonics for each fundamental frequency up to an $N^{th}$ harmonic, a substantially short circuit at one or more odd harmonics for each fundamental frequency up to an $N^{th}$ harmonic, and a substantially capacitive impedance load at the remaining harmonic overtones, up to an $N^{th}$ harmonic.

In a more detailed implementation of this push-pull amplifier, the amplifier further includes a transformer connected to the outputs of the two active devices and the load such that the load is dc isolated from the outputs of the two active devices via the transformer.

In a detailed embodiment of one aspect of the present invention, a quasi-class $E/F_3$ high efficiency amplifier for amplifying an input signal having at least one fundamental frequency and adapted to drive a load is disclosed. This amplifier includes a high speed active device that comprises a switching component that operates substantially as a switch and a parasitic capacitance, $C_{out}$, in parallel with the switching component and an LC parallel tank circuit that is resonant at the second harmonic of the fundamental frequency. The active device is connected in series to the load through the LC parallel tank circuit.

A method of amplifying an RF signal with an active device switch is also disclosed. The method includes amplifying the signal with an active device that comprises a switching component that operates substantially as a switch and a parasitic capacitance, $C_{out}$, in parallel with the switching component. The method includes tuning the amplified signal to provide a substantially inductive load to the switching component at the fundamental frequency, tuning the amplified signal to provide a substantially open circuit to the active device at selected even harmonic overtones, tuning the amplified signal to provide a substantially short circuit to the active device at selected odd harmonic overtones; and providing substantially capacitive loading to the active device for the non-selected harmonic overtones.

Several detailed implementations of the hybrid class E/F load network of the amplifier of the present invention are disclosed. In one embodiment, the network is configured to present to the switching component, at all harmonic frequencies substantially present in at least one of the voltage and current waveforms of the active device, a substantially inductive load at each fundamental frequency, a substantially open circuit at the $2^{nd}$ harmonic, and a substantially capacitive impedance load at the remaining harmonic overtones, up to an $N^{th}$ harmonic, where $N \geq 3$.

In an alternative implementation, the network is configured to present to the switching component, a substantially inductive load at each fundamental frequency; a substantially short circuit at the $3^{rd}$ harmonic, and a substantially capacitive impedance load at the remaining harmonic overtones, up to an $N^{th}$ harmonic where $N \geq 3$.

In a third detailed implementation, the hybrid class E/F load network is configured to present to the switching component a substantially inductive load at each fundamental frequency, a substantially short circuit at the $3^{rd}$ harmonic, a substantially open circuit at the $2^{nd}$ harmonic, and a substantially capacitive impedance load at the remaining harmonic overtones, up to an $N^{th}$ harmonic, where $N \geq 4$.

In a fourth detailed embodiment, the hybrid class E/F load network is configured to present to the switching component a substantially inductive load at each fundamental frequency a substantially open circuit at the $4^{th}$ harmonic, and a substantially capacitive impedance load at the remaining harmonic overtones, up to an $N^{th}$ harmonic, where $N \geq 4$.

In a fifth detailed embodiment, the hybrid class E/F load network is configured to present to the switching component a substantially inductive load at each fundamental frequency a substantially open circuit at the $2^{nd}$ and $4^{th}$ harmonics, and a substantially capacitive impedance load at the remaining harmonic overtones, up to an $N^{th}$ harmonic, where $N \geq 4$.

In a sixth embodiment, the hybrid class E/F load network is configured to present to the switching component a substantially inductive load at each fundamental frequency a substantially short circuit at the $3^{rd}$ harmonic, a substantially open circuit at the $4^{th}$ harmonic, and a substantially capacitive impedance load at the remaining harmonic overtones, up to an $N^{th}$ harmonic, where $N \geq 4$.

In a seventh detailed embodiment, the hybrid class E/F load network is configured to present to the switching component a substantially inductive load at each fundamental frequency a substantially short circuit at the $3^{rd}$ harmonic, a substantially open circuit at the $2^{nd}$ and $4^{th}$ harmonics, and a substantially capacitive impedance load at the remaining harmonic overtones, up to an $N^{th}$ harmonic, where $N \geq 5$.

In an eighth detailed embodiment, the hybrid class E/F load network is configured to present to the switching component a substantially inductive load at each fundamental frequency; a substantially short circuit at all odd harmonic overtones up to an $N^{th}$ harmonic, a substantially capacitive impedance load at the remaining harmonic overtones, up to an $N^{th}$ harmonic, where $N \geq 5$.

In a ninth disclosed detailed embodiment, the hybrid class E/F load network is configured to present to the switching component a substantially inductive load at each fundamental frequency a substantially short circuit at all odd harmonic overtones up to an $N^{th}$ harmonic, a substantially open circuit at a predetermined number, $N_E$, of even harmonic overtones for each fundamental frequency up to an $N^{th}$ harmonic, a substantially capacitive impedance load at the remaining harmonic overtones, up to an $N^{th}$ harmonic, where $N \geq 5$ and $0 < N_E \leq (N-2)/2$.

Other features and advantages of the present invention will become apparent from the following detailed description, taken in conjunction with the accompanying drawings, which illustrate, by way of example, the principles of the invention.

BRIEF DESCRIPTION OF THE DRAWINGS

FIG. 2 is a conceptual block diagram of a conventional class E power amplifier circuit;

FIG. 3 is a conceptual block diagram of a conventional class $F^{-1}$ power amplifier circuit;

DETAILED DESCRIPTION OF THE PREFERRED EMBODIMENTS

The present invention allows the achievement of higher performance than either the conventional class E or class $F^{-1}$ amplifiers by incorporating some of the best features of both in a single design.

In general, the present invention employs the inductive-load phase correction technique of the class E amplifier to achieve ZVS switching conditions in the presence of a significant active device output capacitance, while simultaneously allowing some of the harmonic tuning benefits of the class $F^{-1}$ amplifier. The invention allows the efficiency and output power of the active device to be improved by tuning some of the harmonics like a class-$F^{-1}$ amplifier (i.e. open-circuit for even harmonics, short-circuit for odd harmonics), while allowing the remaining un-tuned harmonics to be capacitive as in a class-E amplifier. Since the un-tuned harmonics are capacitive, this tuning strategy allows the device capacitance to be easily incorporated into the circuit as in class-E, and the circuit can remain relatively simple since tuning circuits are required only for those harmonics tuned to open-circuit or short-circuit. Like class-E amplifiers, the amplifiers of the present invention may approach 100% efficiency with a simple circuit consisting of a finite number of elements, whereas class-F and class-F$^{-1}$ designs can only approach 100% as the number of harmonics tuned approaches infinity. Additionally, the invention allows ZVS operation by tuning the fundamental frequency to present an inductive load (i.e. a load consisting of both an inductance and a resistance) to the device, where the inductance and resistance are appropriately sized relative to the capacitance $C_S$ so as to offset the capacitive effect of the un-tuned harmonics and bring the voltage to zero just before the switch closes each cycle. This inductance can be achieved by placing an appropriately-sized inductor in series with the load, but other solutions such as a shunt inductor or transmission line segments may also be used and are thus within the scope of the present invention.

Figure 1:
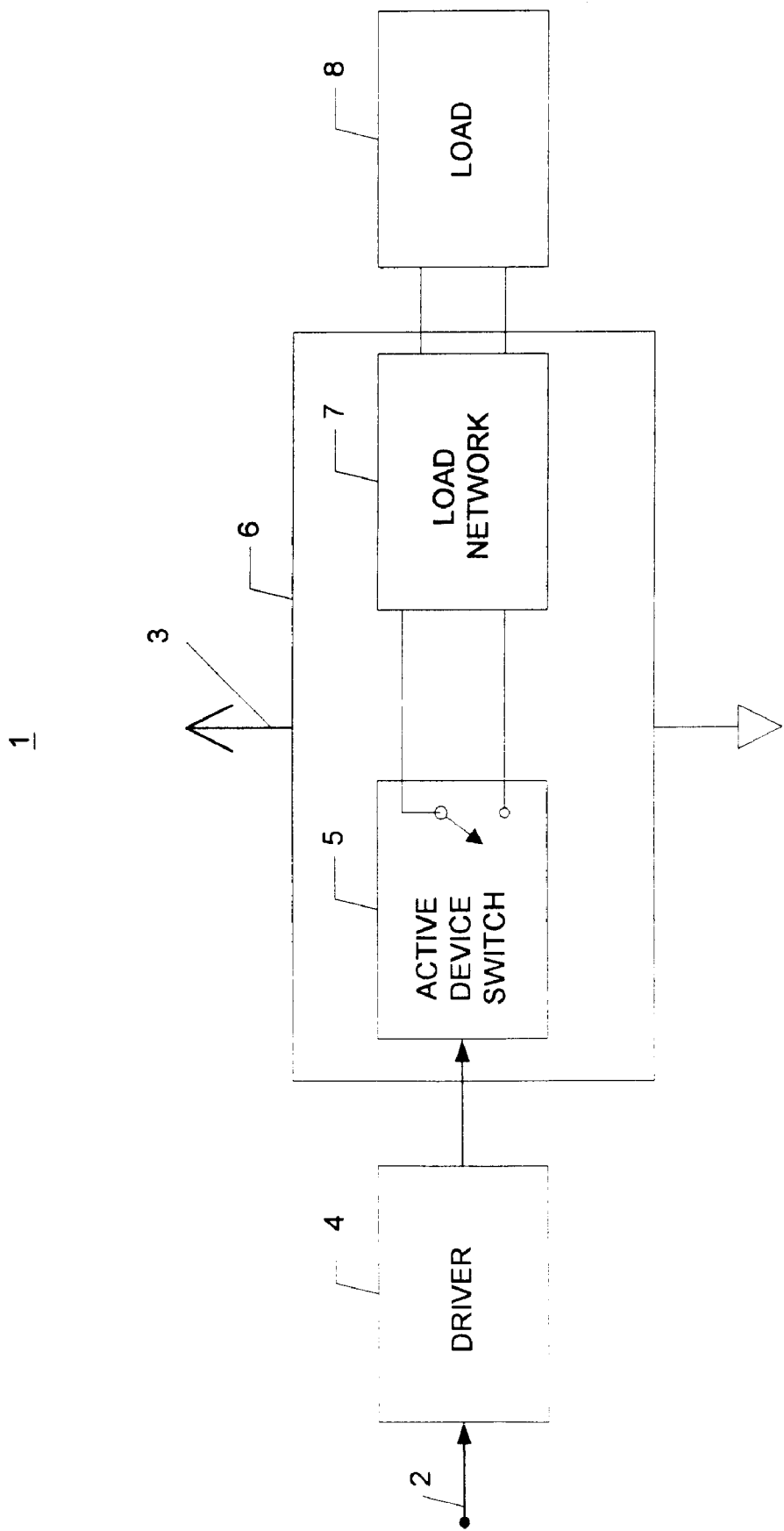
FIG. 1 is a simplified block diagram of conventional RF power transmission system that incorporates a switching power-amplifier connected to a load.
Figure 4:
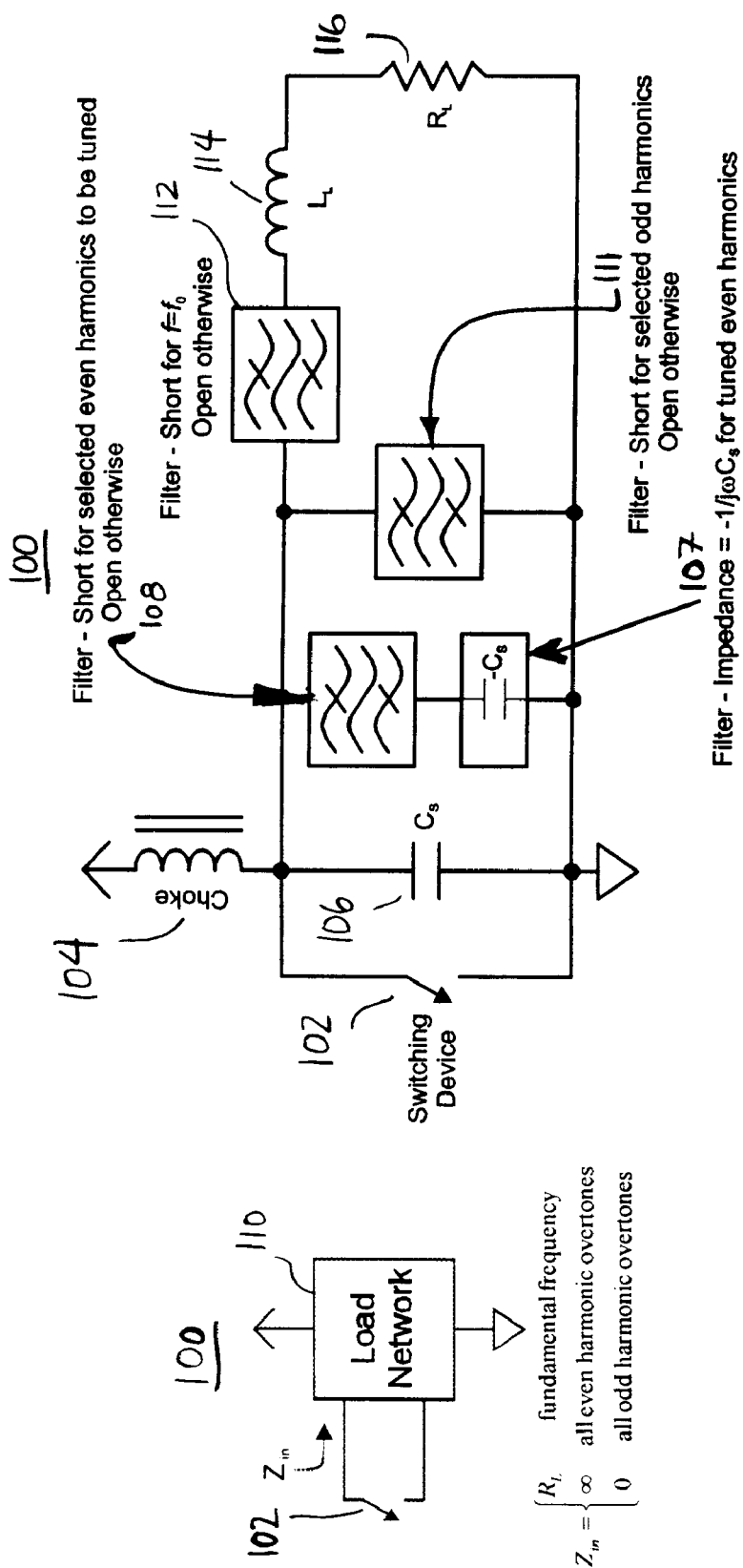
FIG. 4 is a conceptual block diagram showing one circuit topology of the novel class E/F power amplifier of the present invention.

The topology of one such preferred embodiment is seen in FIG. 4. The switching power amplifier 100 includes an active device. The active device comprises a switching component 102 that operates substantially as a switch (hereinafter the term "switch" will be used interchangeably with the term "switching component" to denote that portion of the active device that operates substantially as a switch) and a parasitic capacitance, $C_{out}$, in parallel with the switching component. It should be understood that in all of the following implementations of the present invention, the impedances presented are with respect to the switching component of the active device and thus includes the inherent parasitic capacitance of the device. Moreover, the term active device is to be understood in the broadest sense to include any appropriate three terminal active device such as a FET or CMOS transistor.

The device is connected to an output circuit load network 110. The network includes an even harmonic filter 108 in series with a "negative capacitance" filter 107, which are in parallel with the switch 102 and the shunt capacitance, denoted as $C_s$, 106 (which may equal $C_{out}$, the switch's inherent capacitance or may be $C_{out}$+added capacitance), an odd harmonic filter 111 also in parallel with the switch, a fundamental frequency filter 112 in series with the output of the switch and the load and added inductance $L_L$ 114 in series with the primarily resistive load 116. The even harmonic filter 108 presents a substantially short circuit at selected even harmonics and an open otherwise. Thus, at these harmonics the "negative capacitance" filter 107, having an impedance $-1/j\omega C_s$ at these harmonics is in parallel with the shunt capacitance $C_s$ 106 with an impedance $1/j\omega C_s$, and so the combined impedance of these two elements is substantially equal to an open-circuit. The odd harmonic filter 111 presents a short circuit at the selected odd harmonics and an open otherwise, short-circuiting the active device at these harmonics. The series fundamental frequency filter 112 presents to the switch a short circuit at the fundamental frequency and an open circuit otherwise. The phase-control inductance, denoted as inductor $L_L$ 114, is placed in series with the resistive load, denoted as resistor $R_L$ 116.

Taken together, as seen in FIG. 4, this network thus presents a substantially inductive load at the fundamental frequency $(Z_{in}=(R_L+j\omega_0 L_L)\|(1/j\omega_0 C_S)=R_{eff}+j\omega_0 L_{eff})$, a substantially open circuit at any number of pre-selected even harmonic overtones $(Z_{in}=\infty)$, a substantially short-to-ground at any number of pre-selected odd harmonic overtones $(Z_{in}=0)$, and capacitive impedance to ground at the remaining overtones $(Z_{in}=1/j\omega C_S)$.

Power amplifiers using this novel technique and topology will be classified as class E/F amplifiers. As this topology covers of a family of amplifiers, specific implementations may be denoted as class E/F$_{n1, n2, n3, etc.}$, wherein the various subscripts are numbers denoting the harmonics for which the amplifier's load network has class F$^{-1}$ impedances. For instance, class E/F$_{2, 3, 5}$ would describe an amplifier with a load network presenting to the active device an inductive load at the fundamental, open circuit at the second harmonic, short circuit at the third and fifth harmonics, and a capacitive load for the remaining overtones.

The advantages of this new class of amplifiers are numerous and may include: (a) higher efficiency and/or output power when compared to a similar class E amplifier; (b) reduced circuit complexity with comparable or better efficiency and/or output power when compared to a similar class F or class F$^{-1}$ amplifier; (c) reduced peak voltage relative to the DC voltage when compared to a similar class E amplifier; (d) reduced peak current relative to the DC current when compared to a similar class E amplifier; and (e) allows for the incorporation of the switch's parasitic capacitor into the circuit while simultaneously achieving zero voltage switching (ZVS), unlike a class F or class F$^{-1}$ amplifier.

Moreover, the number of even and odd harmonic overtones that are controlled may be adjusted. Realizing that higher-order harmonics tend to have less effect on the efficiency than the lower-order ones, and that the finite active device switching speed will effectively reduce the generation of higher-frequency harmonic components, the class E/F switching power amplifier of the present invention may include a switching device connected to the output circuit presenting an inductive load at the fundamental frequency, an open circuit at selected even harmonic overtones up to N$^{th}$ harmonic, shorts to ground at selected odd harmonic overtones up to N$^{th}$ harmonic, and capacitive loads at the remaining overtones up to the N$^{th}$ harmonic. The impedances of the output circuit above N$^{th}$ harmonic may be any impedance where N is a number equal to or greater than 3.

It should be understood that the advantages of the present invention are measured relative to the performance characteristics of conventional class E and class F (and/or F$^{-1}$) power amplifiers. Although the performance is generally best when tuned-harmonics have been completely short-circuited or open-circuited, this condition is not usually possible to achieve in practice and the designer must be content with reducing or increasing the magnitude of the impedance as much as possible respectively. Thus, the present invention broadly contemplates load networks that present impedances other than those described in connection with FIG. 4. Thus, for example, the filters 108, 110 and 112 of FIG. 4 may be designed to present (a) impedances larger than those presented by class E amplifiers at selected even harmonic overtones $(Z_{in}>1/j\omega C_s)$ (but not necessarily infinite), (b) impedances that are smaller than those presented by class E amplifiers $(Z_{in}<1/j\omega C_s)$ at selected odd harmonic overtones (Zin), and class-E-like capacitive impedances $(Z_{in}\approx 1/j\omega C_s)$ at the remaining overtones. Again, the resistance and inductance of the inductive load at the fundamental frequency are selected so as to achieve ZVS switching conditions. Such amplifiers may be classified as "quasi-class E/F" power amplifiers. It should be understood by those skilled in the art that these amplifiers can be easier to design and implement than their similar class E/F amplifier counterparts shown in FIG. 4 as they can use fewer components and lower quality components. They may even provide better performance than "true" class E/F amplifiers for some applications, such as when design factors (e.g. available component sizes, low component quality factors, etc.) other than the active device efficiency and output power are motivating the requirements of the load network.

Specific Implementations

Figure 4B:
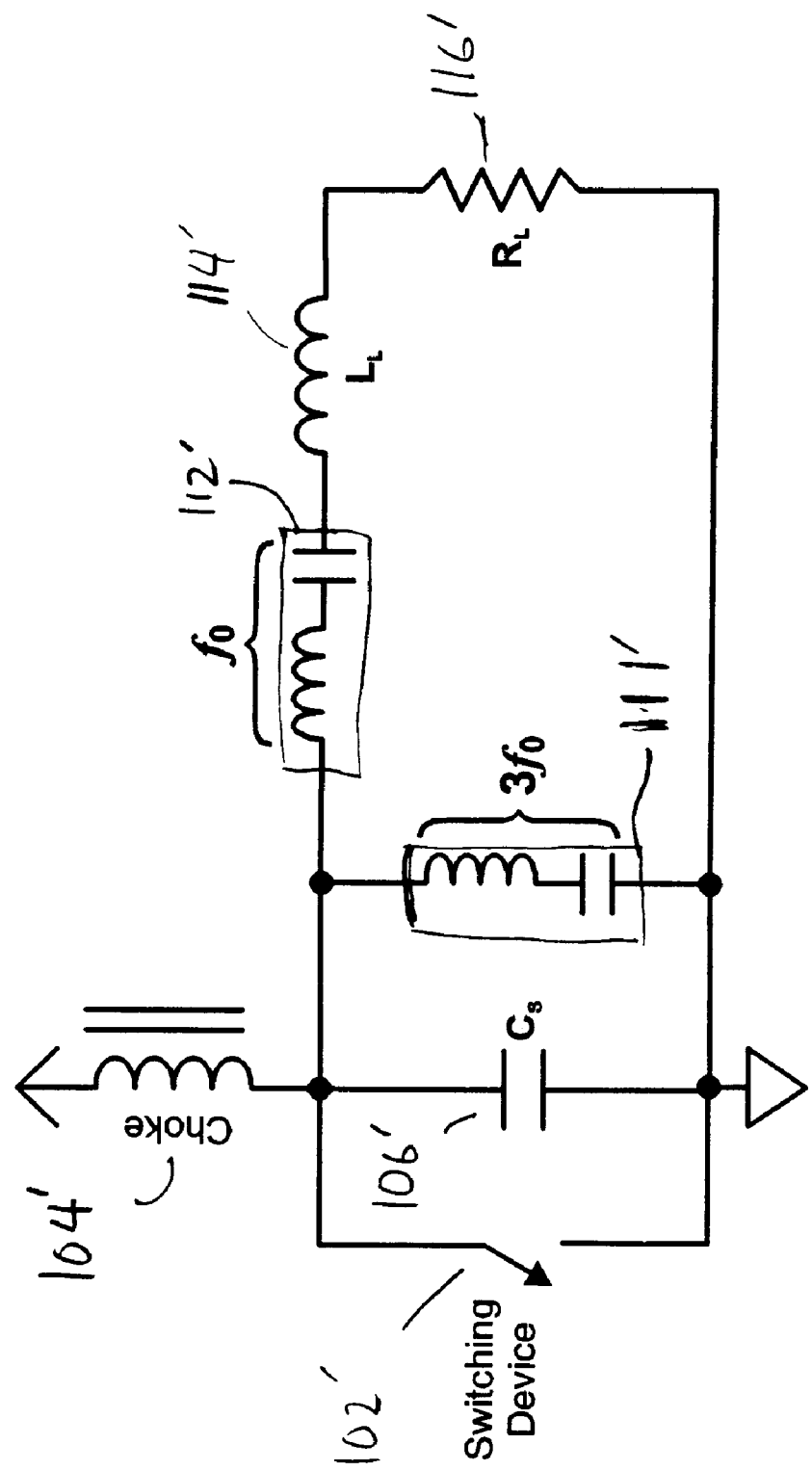
FIG. 4B is a schematic of one preferred implementation of a novel class $E/F_3$ amplifier using two resonators to accomplish the harmonic tuning.

The novel circuit topology of the present invention may be implemented in a variety of circuits. Single-active-device designs such as shown in FIG. 4 can be used to implement E/F designs in a very straightforward manner. For instance, to construct an E/F$_3$ amplifier, a circuit such as shown in FIG. 4B may be employed. The circuit consists of the active device 102' in parallel with a shunt capacitance C$_S$ 106', to which are connected a series LC resonator 111' tuned to short-circuit the third harmonic, and an inductive load, through a second series LC resonator 112' tuned to resonate at the fundamental frequency. The inductive load consists of the load to be driven R$_L$ 116' and a phase-correction inductor L$_L$ 114'. A choke 104' provides connection to the dc power supply. Thus the circuit satisfies the E/F$_3$ conditions by providing to the switch a short-circuiting at the third harmonic, an inductive load at the fundamental, and capacitive impedances at the remaining harmonics. It should be understood that the capacitance C$_S$ may not be an explicit component added by the designer, but may consist partially or entirely of the active device's parasitic output capacitance. Of course, many variations of this circuit are readily devised by one skilled in the art, such as combining the inductance of the fundamental frequency resonator 112' and the phase-correction inductor, L$_L$, 114' into one component, thereby reducing the component count.

Figure 4C:
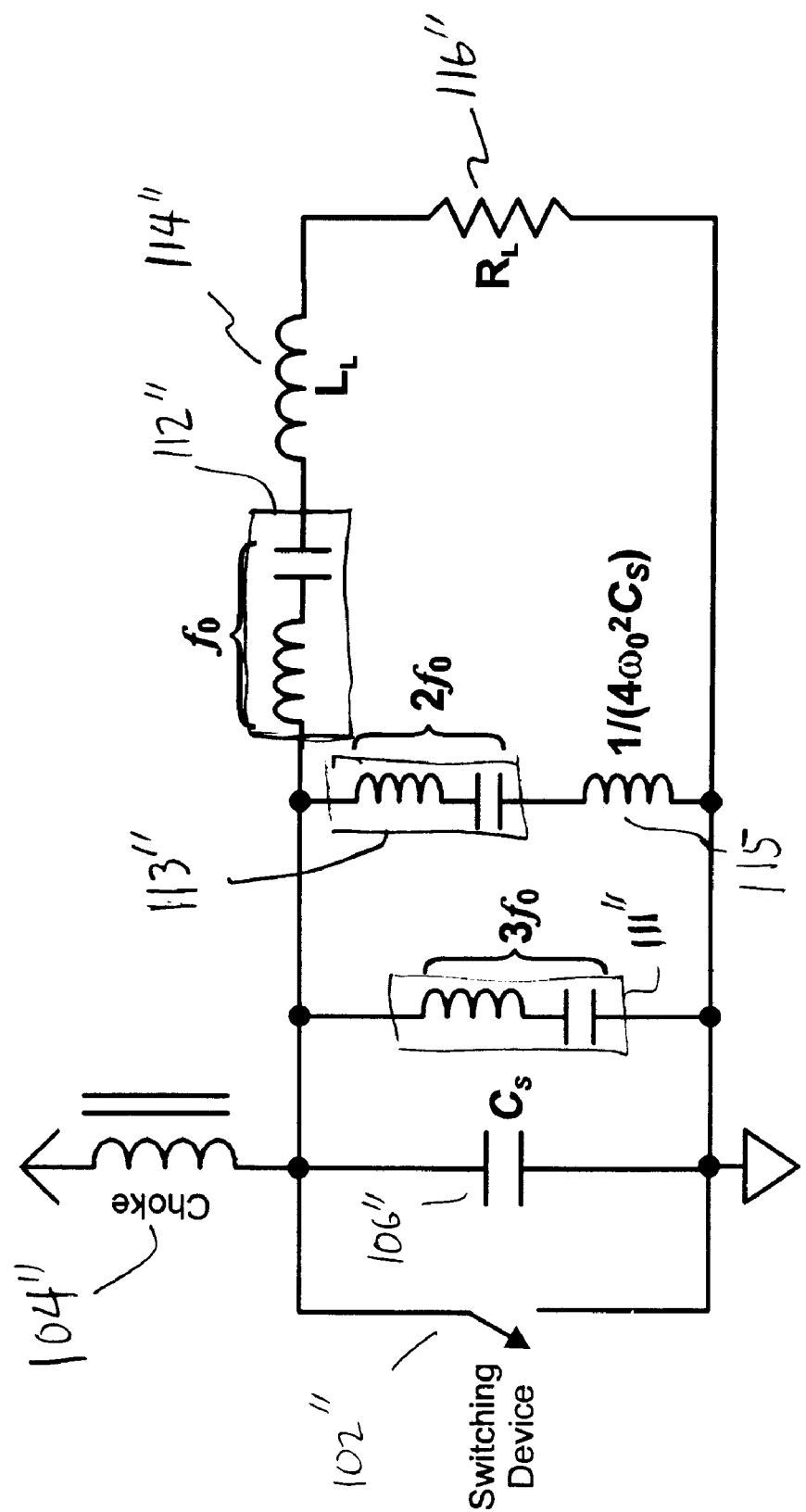
FIG. 4C is a schematic of one preferred implementation of a novel class $E/F_{2,3}$ amplifier using two resonators to accomplish the harmonic tuning.

FIG. 4C shows another example of a single-active-device design, in this case an E/F$_{2,3}$ implementation. This circuit consists of the active device 102" connected to a capacitance C$_S$, and three resonant circuits. The first resonant circuit is a series LC filter 111" tuned to the third harmonic so as to short-circuit the active device at this frequency. The second is also a series LC resonator 113" tuned to the second harmonic, which is connected to the active device in series with an inductor 115 with a value of $\frac{1}{4}\omega_0^2 C_S$. This circuit will provide the active device with an open-circuit at the second harmonic by resonating with the capacitance C$_S$ at this frequency. The third circuit is a series LC resonator 112" tuned to the fundamental frequency, to which is connected an inductive load consisting of an inductance L$_L$ 114" and the resistive load to be driven R$_L$ 116". A choke 104" provides connection to the dc power supply. Thus the circuit satisfies the E/F$_{2,3}$ conditions by open-circuiting the active device at the second harmonic, short-circuiting the active device at the third harmonic, providing an inductive load at the fundamental, and providing capacitive impedances at the remaining harmonics. Again, it should be understood that the capacitance C$_S$ may not be an explicit component added by the designer, but may consist partially or entirely of the active device's parasitic output capacitance.

Figure 4D:
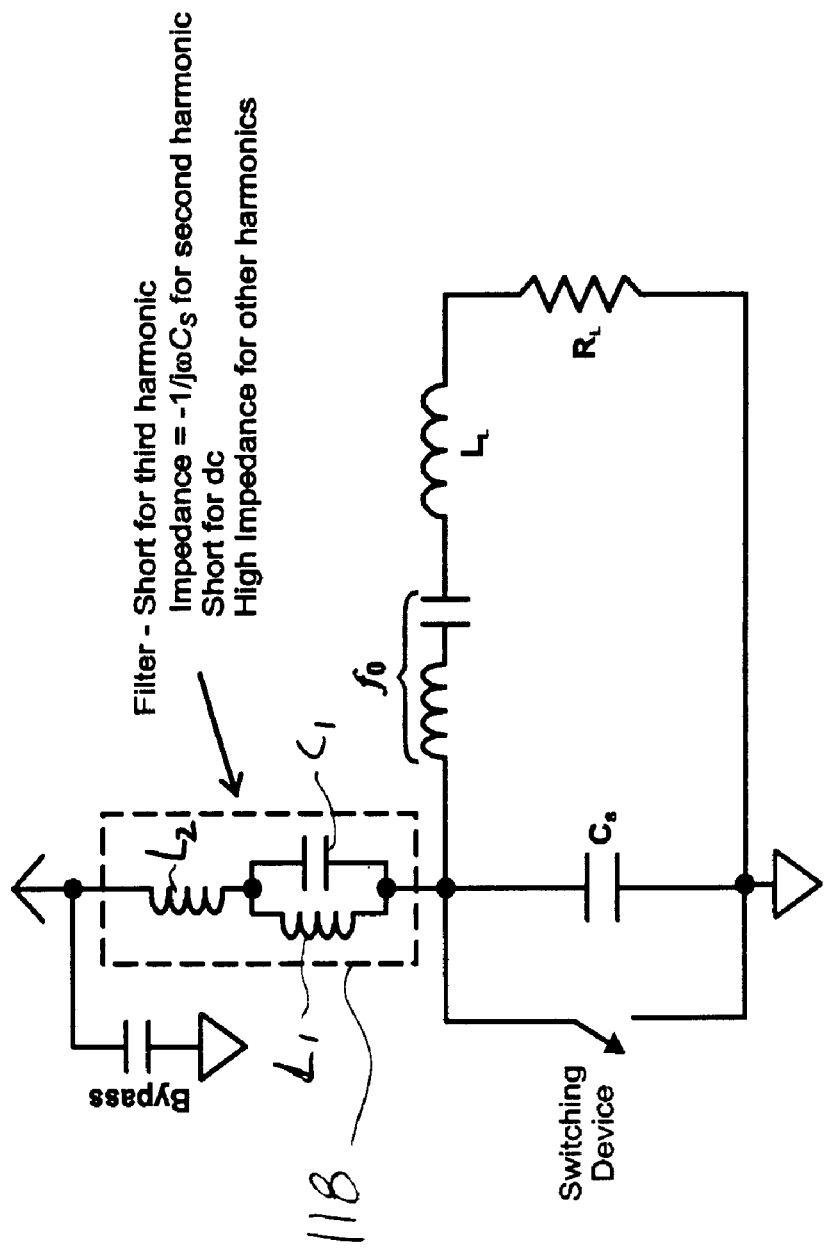
FIG. 4D is a schematic of one preferred implementation of a novel class $E/F_{2,3}$ amplifier using a dual-resonant filter to accomplish the harmonic tuning.

Such direct implementations as shown in the previous two examples are not the only means to implement class E/F amplifiers. For instance, FIG. 4D shows an alternate implementation for E/F$_{2,3}$ using a dual-resonant filter network 118 to accomplish both second and third harmonic tunings. Such a filter can be implemented as shown in the figure using only two inductors L$_1$ and L$_2$ and one capacitor, C$_1$. This network also passes dc currents, and so it can also replace the choke by placing it between the active device and the dc voltage supply. The fundamental frequency filter, shunt capacitance and load inductance are similar to the equivalent components in FIGS. 4B and 4C.

Moreover, a very wide range of E/F designs can be accomplished using push/pull techniques. Due to the different symmetries of the even and odd harmonics of push/pull amplifiers, the push/pull approach can greatly simplify the selective tuning of even and odd harmonics. In one such circuit, shown conceptually in FIG. 5, the class E/F amplifier includes two switching devices 122, 126 connected in a push-pull configuration, each with a shunt capacitor 124, 128, respectively. Both an inductive load 130, represented by a resistor 132 and inductor 134, and a resonant circuit 140 are connected between the switches. The filter 140 acts (a) to short-circuit the two switches together for all odd harmonic overtones, (b) as an open circuit at the fundamental, and (c) has arbitrary impedances at the remaining overtones. To provide DC power, one or more chokes 142, 144 may be placed in such a way as to allow direct current into both switches.

Figure 5:
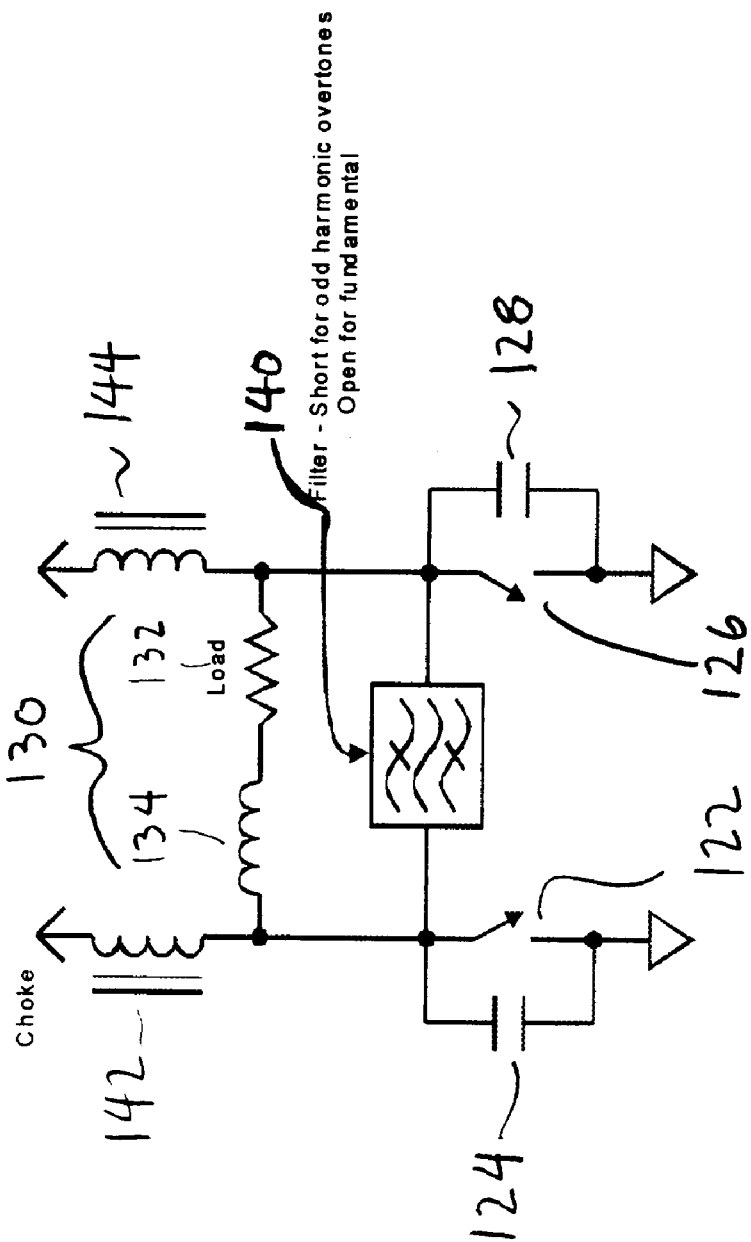
FIG. 5 is a conceptual schematic of one preferred implementation of the novel class $E/F_{odd}$ amplifier of the present invention using a push-pull amplifier configuration.

The design, operation, and performance of the circuit shown in FIG. 5 follows the principles of two class E/F amplifiers connected in a push-pull configuration, each assisting the other in providing the appropriate harmonic tunings. Both switches are connected to the inductive load 130 at the fundamental frequency in classical push-pull fashion, making the impedance at this frequency on each switch equal to one half that of this inductive load. The odd harmonic overtones are short-circuited to each other through the filter, and therefore each is shorted to virtual ground due to the symmetric nature of the push-pull amplifier. This can be easily seen since the odd harmonics voltages of a push/pull amplifier's active devices must be 180° out-of-phase, thus if each is shorted to the other then both must be zero. Similarly, the load and resonator are effectively removed from the circuit at the even harmonic overtones due to differential symmetry considerations, leaving each active device at these frequencies with a capacitive load consisting only of its shunt capacitance C$_S$. This is because the even harmonic voltages of a push/pull amplifier are in-phase, thus the current through a differential load at these frequencies must be zero and the differential load will have no effect on the circuit for these harmonics. Thus, the circuit satisfies the conditions of class E/F amplification by providing short-circuits to the switch at all odd harmonics, capacitive load at all even harmonics, and inductive load at the fundamental. To denote that the amplifier has a load network supplying a class-F$^{-1}$ impedance of short-circuit to ground at all odd harmonic overtones, the denotation class E/F$_{odd}$ is suggested, where the odd subscript denotes that all odd harmonic overtones have been short-circuited.

This circuit topology may offer several advantages. Using only a relatively small number of circuit components, this amplifier may be constructed with performance similar to a single-ended class E/F amplifier requiring many more components. The number of components is independent of the number of the order of odd harmonic overtones being tuned. A conventional single-ended implementation (i.e., a single-device switching amplifier) requires a larger number of tuned components proportional to the total number of the overtones being controlled.

Moreover, in narrow-band applications, the resonator may be constructed using a simple parallel-connected LC resonator. Several advantages are provided using this simplified design. First, in this case, only one component needs to be tuned to short ALL of the odd overtones. For single-ended solutions this would require tuning a number of components proportional to the number of overtones being shorted.

Second, the loaded Q of the LC parallel resonant circuit may be relatively low, even as low as one (although the third-harmonic in very low-Q cases is not very well shorted, making this case a quasi-class E/F design). This permits the use of very low unloaded-Q inductors allowing the use of this topology for applications like Si (silicon) substrate-based integrated circuits where any typical inductor presents a very low unloaded-Q of around 5, making the use of a low loaded-Q filter a necessity. A conventional approach using a class E or class F amplifier generally requires filters with loaded Q of at least 3.

Third, the series inductor in the load may be represented as an equivalent parallel inductor and incorporated into the LC tank, reducing the number of components further.

Figure 6:
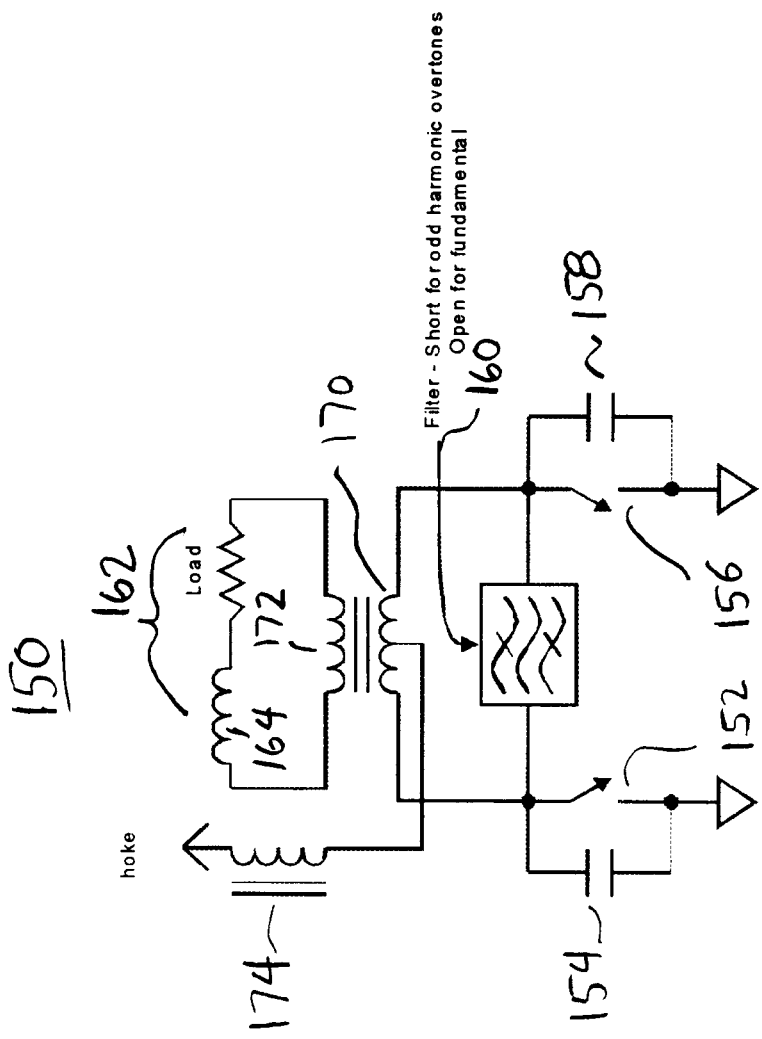
FIG. 6 is a conceptual schematic of an alternative design to the class $E/F_{odd}$ push-pull amplifier circuit shown in FIG. 5, wherein the load is coupled to the circuit via a transformer.

In a variation to the circuit shown in FIG. 5, FIG. 6 shows yet another novel circuit topology of a power amplifier circuit 150 that implements the class E/F amplifier with two switching devices 152, 156 connected in a push-pull configuration, each with a shunt capacitor 154, 158, respectively. In particular, connected between the switches are both the primary 170 of a transformer and a resonant circuit 160 which short-circuits the two switches together for all odd harmonic overtones, presents an open circuit at the fundamental, and has arbitrary impedances at the remaining overtones. Connected to the secondary 172 of the transformer is an RL load 162. To provide DC potential, a choke 174 (or more than one) is placed in such a way as to allow direct current into both switches. Several variations of this circuit will be recognized by those skilled in the art since the load inductance 164 and the resonant circuit 160 may be connected on either side of the transformer, primary 170 or secondary 172 circuit, after proper impedance transformation. Additionally, the load inductance may also be incorporated into the resonator inductance. If desired, the parasitic inductances of the transformer may be used as elements in the resonant circuit 170 and for the load inductance 164, reducing the part count and allowing for the incorporation of transformer parasitics into the design.

The design, operation, and performance of such amplifiers follow exactly the principles of the class $E/F_{odd}$ push-pull amplifiers described above. In addition to all the advantages described in the design shown in FIG. 5, in this design (a) the output load is DC isolated from the switching circuit and supply; (b) the output load may be connected in unbalanced mode; and (c) the transformer turn ratio may be used to help match the switch output impedance to the load impedance.

Figure 7:
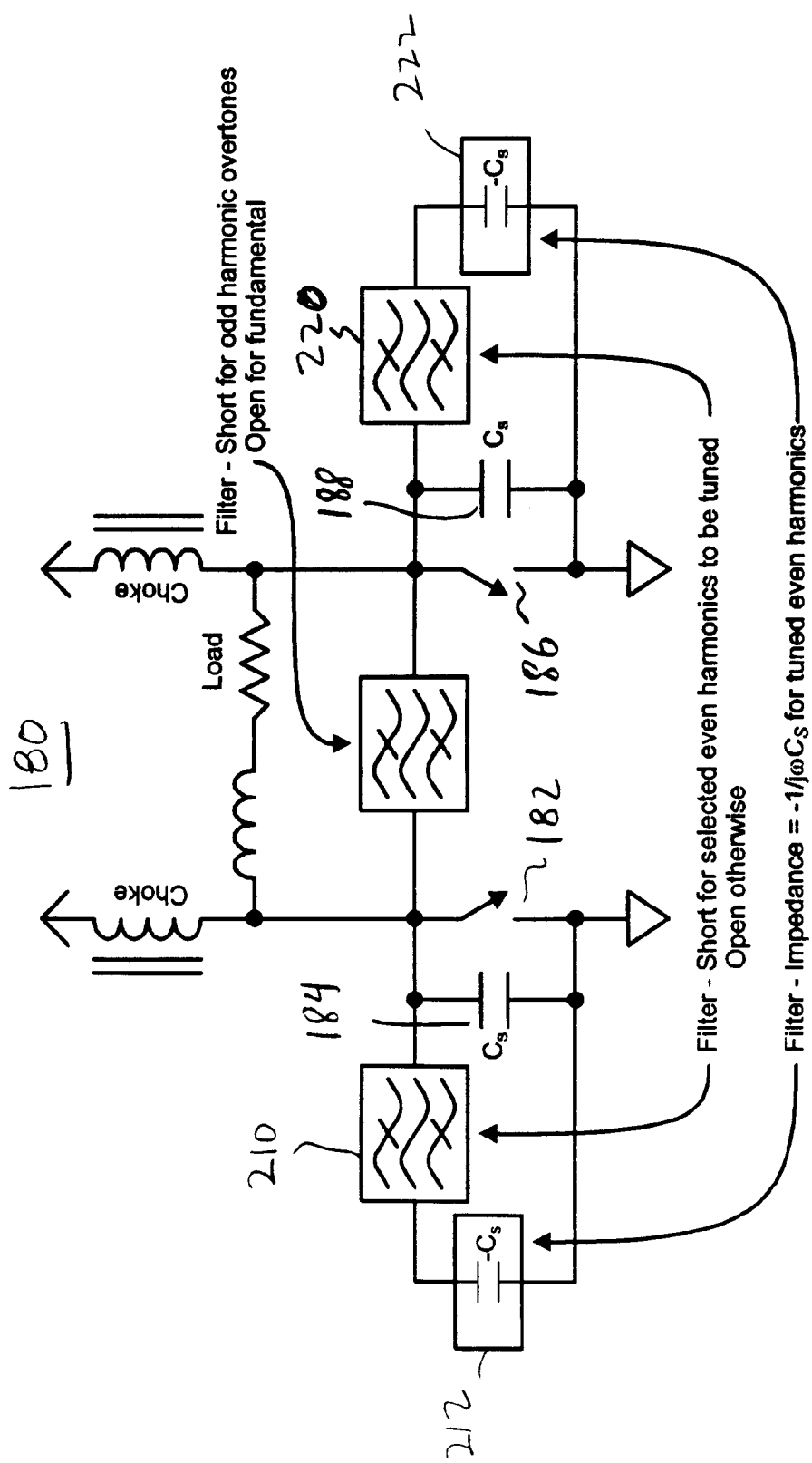
FIG. 7 is a conceptual schematic of a class $E/F_{x,odd}$ push-pull amplifier which is an improvement to the circuit shown in FIG. 5, wherein even harmonic tuning is included.

In yet another embodiment, the present invention may use additional tuning circuits in parallel with each switch of the circuits shown in FIGS. 5 and 6 so as to selectively open circuit a number of even harmonic overtones. FIG. 7 shows a schematic diagram of a circuit 180 for accomplishing this as well as a possible implementation strategy. By placing additional circuits 210/212 and 220/222 which supply a suitable inductive impedance in parallel with the switching devices' 182 and 186 parallel capacitances 184 and 188, respectively, at various even harmonic overtones, the class $E/F_{odd}$ amplifier concept may be extended to allow also for the open-circuiting of any number of even harmonics, providing potential additional performance benefits. The denotation class $E/F_{n1, n2, \ldots, odd}$ is suggested for such amplifiers, where the numerical subscripts identify the even harmonic overtones being open circuited. In addition to the benefits described in relation to the circuits shown in FIGS. 5 and 6, this improvement offers increased efficiency over class $E/F_{odd}$.

It should be understood by those skilled in the art that as a new class of amplifiers, the present invention encompasses a virtually unlimited number of specific class E/F networks. However, for practical design considerations, the present invention specifically discloses several lower-order harmonic tuning networks. Specifically, these networks includes those that present: (a) a substantially open circuit at the $2^{nd}$ harmonic; (b) a substantially short circuit at the $_3$rd harmonic, (c) a substantially short circuit at the $3^{rd}$ harmonic and a substantially open circuit at the $_2$nd harmonic; (d) a substantially open circuit at the $4^{th}$ harmonic; (e) a substantially open circuit at the $2^{nd}$ and $4^{th}$ harmonics; (e) a substantially short circuit at the $3^{rd}$ harmonic and a substantially open circuit at the $4^{th}$ harmonic; (f) a substantially short circuit at the $3^{rd}$ harmonic and a substantially open circuit at the $2^{nd}$ and $4^{th}$ harmonics; (g) a substantially short circuit at all odd harmonic overtones up to the $N^{th}$ harmonic, where N is greater than or equal to 5; and (h) a substantially short circuit at all odd harmonic overtones up to the $N^{th}$ harmonic, a substantially open circuit at a predetermined number, $N_E$, of even harmonic overtones for each fundamental frequency up to an $N^{th}$ harmonic, a substantially capacitive impedance load at the remaining harmonic overtones, up to an $N^{th}$ harmonic, where $N \geq 5$ and $0 < N_E \leq (N-2)/2$. It is thus understood that many other networks and related circuits that tune other numbers of even and/or odd harmonics are within the spirit and scope of the invention.

Figure 8:
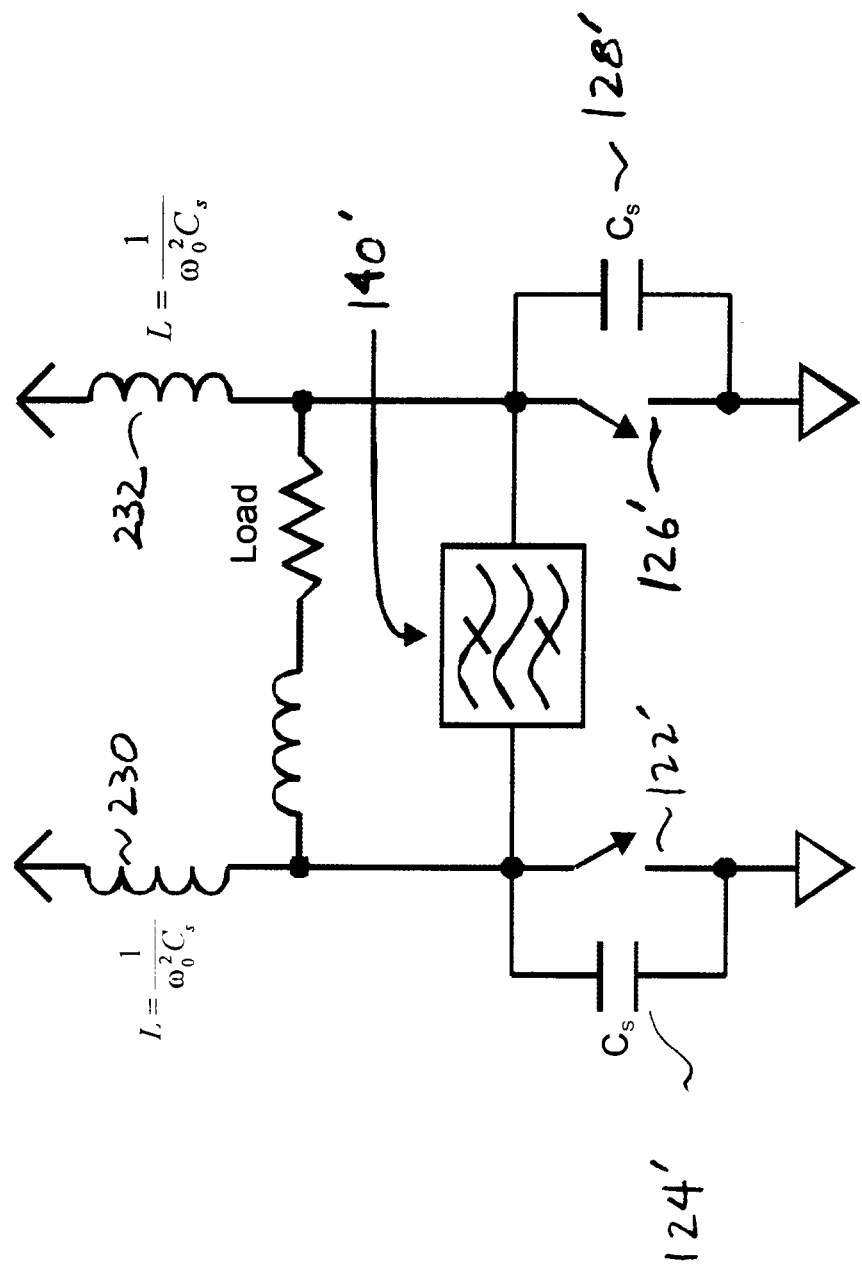
FIG. 8 is a conceptual schematic a class to the class $E/F_{2,odd}$ amplifier, which is yet another improvement push-pull amplifier circuit shown in FIG. 5, wherein second harmonic tuning is included.

In yet a further improvement, circuit size and losses of the amplifier shown in FIG. 5 may be decreased by replacing the DC feed choke(s) with two inductors from the supply voltage to the respective switching devices. As shown in FIG. 8, if each inductor, 230 232, is made to resonate at the second harmonic with the switching device's parallel capacitors $C_s$, 124' and 128', respectively, the resulting class $E/F_{2,odd}$ amplifier benefits from decreased switch losses and possibly reduced losses due to the choke's series resistance.

In yet another implementation of the present invention, a wideband class $E/F_{odd}$ switching amplifier may be constructed in such a way as to have class $E/F_{odd}$ impedances relative to the switch over a range of switching frequencies from $f_1$ to $f_2$ where $f_2 < 3f_1$. The circuit consists of two switching devices connected in a push-pull configuration, each with a shunt capacitor, as shown in FIG. 5. Between the switches are connected both a resistive load and a resonant circuit which short-circuits the two switches together for all frequencies greater than or equal to $3f_1$, and approximates the required inductance to meet the ZVS requirement from $f_1$ to $f_2$. To provide DC potential, one or more chokes may be placed in such a way as to allow direct current into both switches. Constructed in this way, the circuit works as described in connection with FIG. 5 over the switching frequency range from $f_1$ to $f_2$.

Figure 9:
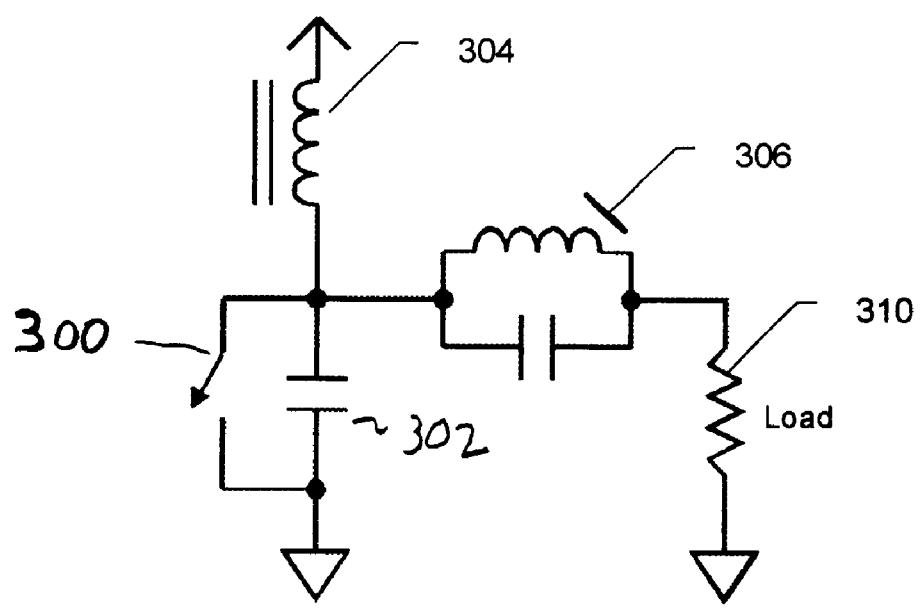
FIG. 9 is a conceptual schematic of a novel quasi class E/F amplifier circuit designed according to the present invention.

FIG. 9 shows a novel implementation of a quasi class $E/F_3$ amplifier consisting of a switch or transistor 300 with parallel capacitor 302. They are connected to the supply through a choke 304. The switch or transistor is connected in series to the load 310 through an LC parallel resonant circuit 306 at the second harmonic. A filtering circuit may be added to avoid the higher order harmonic interference to the load, if the application requires it. After the component values are properly adjusted, this topology provides to the switch or transistor an inductive load at fundamental frequency, capacitive load at second harmonic, low impedance at third harmonic, and uncontrolled low impedances at higher order harmonics. This complies with requirements of quasi-class E/F amplifiers and offers several advantages. First, this modified quasi-class E/F circuit may be implemented using a relatively small number of components. Second, there is only one tuned component in the circuit compared to the conventional ZVS class F amplifiers. Third, the loaded Q of the LC parallel resonant circuit may be very low and may be as low as one. This permits the use of very low unloaded Q inductors allowing the use of this topology for applications like Si (silicon) substrate based integrated circuits where any typical inductor presents a very low Q around 5. A conventional approach using class E or class F amplifiers requires inductors with loaded Q of at least 3. Further, since the resonant tank is a parallel LC rather than the typical series LC found in class E amplifiers, the inductance needed is reduced considerably. This is attractive when the size of the inductor is the limiting factor in reducing amplifier size and weight.

In yet another variation of the topology of the present invention, the class E/F amplifier of the present invention may be tuned to operate in a linear mode, such as class A, class A/B, or class B at lower output power levels and E/F switching mode at higher output power levels. The output power and mode of operation may be varied by changing the input power and/or bias conditions. In this way, an amplifier may be constructed that has the high efficiency advantages of class E/F at the higher power levels while allowing the output power to be modulated or varied by changing drive conditions.

Having thus described exemplary embodiments of the invention, it will be apparent that further alterations, modifications, and improvements will also occur to those skilled in the art. Further, it will be apparent that the presently-described circuit and devices are not limited to any particular type of switching active switching technology, material systems or for any particularly speed, frequency range, or power level of operation. Rather, a broad class of amplifier and associated topologies have been described. Actual implementation of circuits and component types and values will be apparent to those skilled in the art. Accordingly, the invention is defined only by the following claims.

We claim:

1. A high efficiency switching power amplifier for amplifying a high frequency input signal having at least one fundamental frequency, and adapted to drive a load, comprising:
   a high-speed active device that includes
      a switching component that operates substantially as a switch and
      a parasitic capacitance, $C_{out}$, in parallel wit the switching component; and
   a hybrid class E/F load network connected to the active device, wherein the network is configured to present to the switching component, at al harmonic frequencies substantially present in at least one of the voltage and current waveforms f the active device,
      (i) substantially inductive load at each fundamental frequency;
      (ii) a substantially open circuit at a predetermined number, $N_E$, of even harmonic overtones for each fundamental frequency up to an $N^{th}$ harmonic,
      (iii) a substantially short circuit at a predetermined number, $N_O$, of odd harmonic overtones for each fundamental frequency up to an $N^{th}$ harmonic, and
      (iv) a substantially capacitive impedance load at the remaining harmonic overtones, up to an $N^{th}$ harmonic,
      where $N \geq 3$ and $1 \leq N_E + N_O \leq N-2$.

2. The amplifier of claim 1, wherein if $N_E=1$, then $N_O>0$.

3. The amplifier of claim 1, wherein the load network includes a two port filter network having an input port and an output port, he input port being connected to the active device and the output port being connected to the load.

4. A high efficiency switching power amplifier for amplifying a high frequency input signal having at least one fundamental frequency, and adapted to drive a load, comprising:
   a high-speed active device that includes
      a switching component that operates substantially as a switch and
      a parasitic capacitance, $C_{out}$, in parallel wit the switching component; and
   a hybrid class E/F load network connected to the active device, wherein the hybrid class E/F load network is configured to present to the witching component
      (i) a substantially inductive load at the fundamental frequency of operation,
      (ii) a substantially open circuit at a predetermined number of even harmonic overtones of the fundamental frequency,
      (iii) a substantially short circuit at a predetermined number of odd harmonic overtones of the fundamental frequency, and
      (iv) a substantially capacitive impedance load at the remaining harmonic overtones.

5. A high efficiency switching power amplifier for amplifying a high frequency input signal having at least one fundamental frequency, $f_0$, and adapted to drive a load, comprising:
   (a) a high-speed active device that includes
      a switching component that operates substantially as a switch and
      a parasitic capacitance, $C_{out}$, in parallel with the switching component; and
   (b) a hybrid class B/F load network connected to the active device, wherein the network is configured to present to the switching component, at all harmonic frequencies that are substantially present in at least one of the voltage and current waveforms of the active device,
      (i) a substantially inductive load at each fundamental frequency of operation that results in substantially zero-voltage-switching (ZVS) operation of the active device,
      (ii) impedances substantially larger in magnitude than $1/(2\pi fCs)$ a at a predetermined number, $N_E$, of e en harmonic overtones of each fundamental frequency,
      (iii) impedances substantially smaller in magnitude than $1/(2\pi fCs)$ at a predetermined number, $N_O$, of odd harmonic overtones of each fundamental frequency, and
      (iv) an impedance substantially equal to $1/j\omega Cs$ at the remaining harmonic overtones of each fundamental frequency,
   wherein
      $C_s = C_{out} + C_{added}$, where $C_{added} \geq 0$, and
      $N_E \geq 0$, $N_O \geq 0$, and the total number of tuned harmonic overtones, $N_E + N_O$, is at least one and less than the total number of harmonic frequencies substantially present in the active device's at least one of voltage and current waveforms.

6. A high efficiency switching power amplifier for amplifying a high frequency input signal having at least one fundamental frequency and adapted to drive a load, comprising:
   (a) a first high-speed active device that includes
      a switching component that operates substantially as a switch and
      a parasitic capacitance, $C_{out1}$, in parallel with the switching component,
   (b) a second high-speed active device that include
      a switching component that operates substantially as a switch and a parasitic capacitance, $C_{out2}$, in parallel with the switching component, and (c) a hybrid three-port class E/F load network having
   (i) a first port connected to the first active device,
   (ii) a second port connected to the second active device, and
   (iii) a third port connected to the load, such that when the first and second active devices are driven in a push-pull configuration, the network presents to the switching components of the active devices an effective input impedance that provides
   (i) a substantially inductive load in series with the substantially resistive load at all fundamental frequencies;
   (ii) a substantially open circuit at one or more even harmonics for each fundamental frequency up to an Nth harmonic,
   (iii) a substantially short circuit at one or more odd harmonics for each fundamental frequency up to an Nth harmonic, and
   (iv) a substantially capacitive impedance load at the remaining harmonic overtones, up to an Nth harmonic.

7. The amplifier of claim 6, further including a transformer connected to the outputs of the two active devices and the load such that the load is dc isolated from the outputs of the two devices via the transformer.

8. The amplifier of claim 1, wherein the load network is configured to provide wideband tuning of an input signal having a fundamental frequency range from $f_1$ to $f_2$ such that $f_2 \geq f \geq f_1$, where $f_2 \leq 3f_1$.

9. The amplifier of claim 1, wherein the network is configured to present to the switching component, at all harmonic frequencies substantially present in at least one of the voltage and current waveforms of the active device,
   (i) a substantially inductive load at each fundamental frequency;
   (ii) a substantially open circuit at the $2^{nd}$ harmonic, and
   (iii) a substantially capacitive impedance load at the remaining harmonic overtones, up to an $N^{th}$ harmonic, where $N \geq 3$.

10. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at the $3^{rd}$ harmonic, and
   (iii) a substantially capacitive impedance load at the remaining harmonic overtones, up to an $N^{th}$ harmonic, where $N \geq 3$.

11. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at the $3^{rd}$ harmonic,
   (iii) a substantially open circuit at the $2^{nd}$ harmonic, and
   (iv) a substantially capacitive impedance load at the remaining harmonic overtones, up to an $N^{th}$ harmonic, where $N \geq 4$.

12. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially open circuit at the $4^{th}$ harmonic, and
   (iii) a substantially capacitive impedance load at the remaining harmonic overtones, up to an $N^{th}$ harmonic, where $N \geq 4$.

13. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially open circuit at the $2^{nd}$ and $4^{th}$ harmonics, and
   (iii) a substantially capacitive impedance load at the remaining harmonic overtones, up to an $N^{th}$ harmonic, where $N \geq 4$.

14. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at the $3^{rd}$ harmonic,
   (iii) a substantially open circuit at the $4^{th}$ harmonic, and
   (iv) a substantially capacitive impedance load at the remaining harmonic overtones, up to an $N^{th}$ harmonic, where $N \geq 4$.

15. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at the $3^{rd}$ harmonic,
   (iii) a substantially open circuit at the $2^{nd}$ and $4^{th}$ harmonics, and
   (iv) a substantially capacitive impedance load at the remaining harmonic overtones, up to an $N^{th}$ harmonic, where $N \geq 5$.

16. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at all odd harmonic overtones up to an $N^{th}$ harmonic,
   (iii) a substantially capacitive impedance load at the remaining harmonic overtones, up to an $N^{th}$ harmonic, where $N \geq 5$.

17. The amplifier of claim 1, wherein the network is configured to present to the switching component, at all harmonic frequencies substantially present in at least one of the voltage and current waveforms of the active device
   (i) a substantially inductive load at each fundamental frequency;
   (ii) a substantially short circuit at all odd harmonic overtones up to an $N^{th}$ harmonic,
   (iii) a substantially open circuit at a predetermined number, $N_E$, of even harmonic overtones for each fundamental frequency up to an $N^{th}$ harmonic,
   (iv) a substantially capacitive impedance load at the remaining harmonic overtones, up to an $N^{th}$ harmonic, where $N \geq 5$ and $0 < N_E \leq (N-2)/2$.

18. A method of amplifying an RF signal with a high speed active device a that includes a switching component that operates substantially as a switch and a parasitic capacitance, $C_{out}$, in parallel with the switching component, comprising:

amplifying the signal with a high speed active device;

tuning the amplified signal to provide a substantially inductive load to the active device at the fundamental frequency;

tuning the amplified signal to provide a substantially open circuit to the active device at selected even harmonic overtones;

tuning the amplified signal to provide a substantially short circuit to the active device at selected odd harmonic overtones; and providing substantially capacitive loading to the active device for the non-selected harmonic overtones.

* * * * *

UNITED STATES PATENT AND TRADEMARK OFFICE
CERTIFICATE OF CORRECTION

PATENT NO. : 6,724,255 B2
DATED : April 20, 2004
INVENTOR(S) : Scott David Kee et al.

It is certified that error appears in the above-identified patent and that said Letters Patent is hereby corrected as shown below:

Column 15,
Line 40, "wit" should read -- with --;
Line 46, "f" should read -- of --;

Column 16,
Line 4, "wit" should read -- with --;
Line 8, "witching" should read -- switching --;
Line 28, "B/F" should read -- E/F --;
Line 39, formula "$1/(2\pi\ fCs)$" should read -- $1(2\ \pi fC_s)$ --;
Line 39, "e en" should read -- even --;
Line 42, formula "$1(2\pi fCs)$" should read -- $1(2\ \pi fC_s)$ --;
Line 45, formula "$1/j\omega Cs$" should read -- $1/j\omega C_s$ --;
Line 65, "include" should read -- includes --;

Column 17,
Lines 17, 20 and 22, "Nth" should read -- $N^{th}$ --;
Line 30, "$f_1$ to $f_2$" should read -- $f_1$ to $f_2$ --;
Line 31, "$f_2 \geq f \geq f_1$, where $f_2 < 3f_1$" should read -- $f_2 \geq f \geq f_1$, where $f_2 < 3f_1$ --;

Column 19,
Line 2, delete "a" after "device".

Signed and Sealed this

Fourth Day of January, 2005

JON W. DUDAS
*Director of the United States Patent and Trademark Office*